(12) United States Patent
Lin et al.

(10) Patent No.: US 8,579,487 B2
(45) Date of Patent: Nov. 12, 2013

(54) LIGHTING MODULE

(75) Inventors: Mei-Fen Lin, Hsinchu (TW); He-Shun Yang, Hsinchu (TW); Chin-Kun Hsieh, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 13/594,391

(22) Filed: Aug. 24, 2012

(65) Prior Publication Data

US 2013/0051004 A1 Feb. 28, 2013

(30) Foreign Application Priority Data

Aug. 31, 2011 (TW) .............................. 100131223 A

(51) Int. Cl.
*F21V 7/04* (2006.01)
(52) U.S. Cl.
USPC ....... 362/555; 362/576; 362/249.02; 362/231
(58) Field of Classification Search
USPC .............................. 362/555, 576, 231, 249.02
See application file for complete search history.

(56) References Cited

U.S. PATENT DOCUMENTS

| | | | | |
|---|---|---|---|---|
| 7,344,290 B2 * | 3/2008 | Huang et al. | ................... | 362/555 |
| 7,954,988 B2 * | 6/2011 | Lee et al. | ...................... | 362/555 |
| 8,205,998 B2 * | 6/2012 | Ramer et al. | .................... | 362/84 |
| 2009/0284968 A1 * | 11/2009 | Kuo et al. | ..................... | 362/235 |
| 2010/0103661 A1 * | 4/2010 | Chiou et al. | ................... | 362/231 |

* cited by examiner

*Primary Examiner* — Mary Ellen Bowman
(74) *Attorney, Agent, or Firm* — McClure, Qualey & Rodack, LLP

(57) ABSTRACT

A lighting module is provided. The lighting module comprises a circuit board, a first light source array, a second light source array, and a plurality of first light guides. The first light source array is disposed on the circuit board and comprises a plurality of first solid light emitting semiconductors providing a first light with a first wavelength. The second light source array is disposed on the circuit board and comprises a plurality of second solid light emitting semiconductors providing a second light with a second wavelength. The first light guides are disposed on the circuit board and between the second solid light emitting semiconductors. The second solid light emitting semiconductors are located on a side of each of the first light guides, respectively, so that the second light emitted by the second solid light emitting semiconductors enters the first light guides to be uniformly emitted.

24 Claims, 12 Drawing Sheets

LIGHTING MODULE

This application claims the benefit of Taiwan application Serial No. 100131223, filed Aug. 31, 2011, the subject matter of which is incorporated herein by reference.

BACKGROUND OF THE INVENTION

1. Field of the Invention

The invention relates in general to a lighting module, and more particularly to a lighting module using solid light emitting semiconductors as a light source.

2. Description of the Related Art

Most of generally known solid light emitting semiconductor tubes use monochromatic solid light emitting semiconductors as light sources, and hence are unable to provide multi-chromatic tubes in response to the market needs.

According to generally known technologies, solid light emitting semiconductor tubes, in which complementary color solid light emitting semiconductors are combined with white light solid light emitting semiconductors, are also provided. In the above-mentioned solid light emitting semiconductor tubes, the complementary color solid light emitting semiconductors are located between the white light solid light emitting semiconductors are spaced at an equal distance. However, non-uniformity of colors may easily occur due to that the low-density arranged complementary color solid light emitting semiconductors.

SUMMARY OF THE INVENTION

The invention provides a lighting module to resolve the problems encountered in the prior art. The lighting module comprises a circuit board, a first light source array, a second light source array, and a plurality of first light guides. The first light source array is disposed on the circuit board and comprises a plurality of first solid light emitting semiconductors providing a first light with a first wavelength. The second light source array is disposed on the circuit board and comprises a plurality of second solid light emitting semiconductors providing a second light with a second wavelength. The first light guides are disposed on the circuit board and between the second solid light emitting semiconductors. The second solid light emitting semiconductors are located on a side of each of the first light guides, respectively, so that the second light emitted by the second solid light emitting semiconductors enters the first light guides to be uniformly emitted.

According to a first embodiment of the present invention, a lighting module is provided. Since the light (complementary light) emitted by the second solid light emitting semiconductors enters the first light guides to be uniformly emitted, therefore, the light (complementary light) emitted by the second solid light emitting semiconductors and the light (main light) emitted by the first solid light emitting semiconductors are completely mixed, and the non-uniformity of colors is thus avoided.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
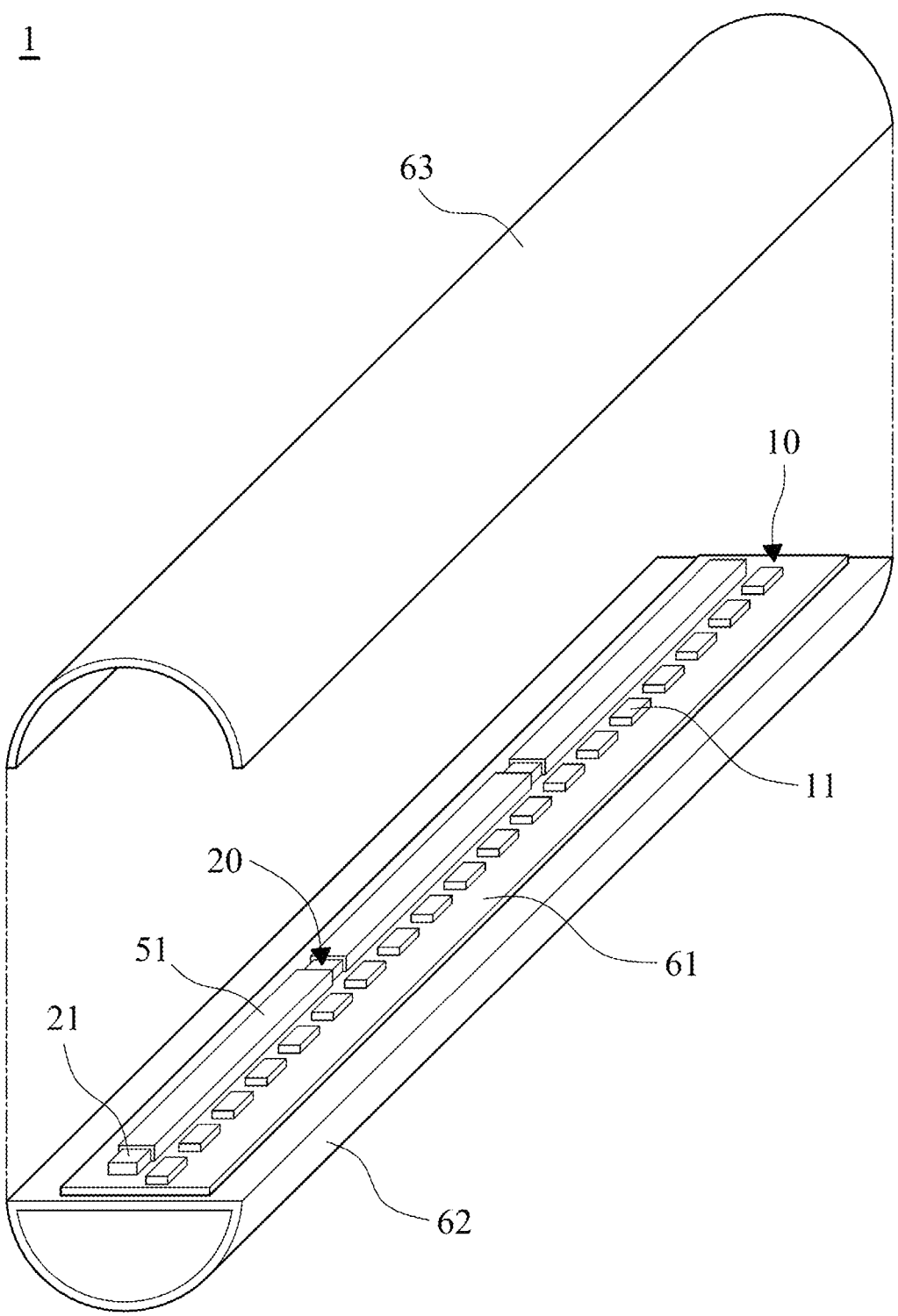
FIG. 1 shows a lighting module according to a first embodiment of the invention.

Referring to FIG. 1, a lighting module according to a first embodiment of the invention is shown. The lighting module 1 comprises a first light source array 10, a second light source array 20, a plurality of first light guides 51, a circuit board 61, a base 62, and a transparent or semi-transparent mask 63.

The first light source array 10 is disposed on the circuit board 61 and comprises a plurality of first solid light emitting semiconductors providing a first light with a first wavelength 11. The second light source array 20 is disposed on the circuit board 61 and comprises a plurality of second solid light emitting semiconductors providing a second light with a second wavelength 21. The first light guides 51 are disposed on the circuit board 61 and between the second solid light emitting semiconductors 21. The second solid light emitting semiconductors 21 are located on a side of each of the first light guides 51, respectively, so that the light emitted by the second solid light emitting semiconductors 21 enters the first light guides 51 to be uniformly emitted. The base 62 is used for carrying the circuit board 61. The transparent or semi-transparent mask 63 is located on the base 62 for covering the circuit board 61.

For the lighting module according to the first embodiment of the invention, the light (complementary light) emitted by the second solid light emitting semiconductors 21 enters the first light guides 51 to be uniformly emitted. Therefore, the light (complementary light) emitted by the second solid light emitting semiconductors 21 and the light (main light) emitted by the first solid light emitting semiconductors 11 can be completely mixed, and the non-uniformity of colors is thus avoided.

Figure 1A:
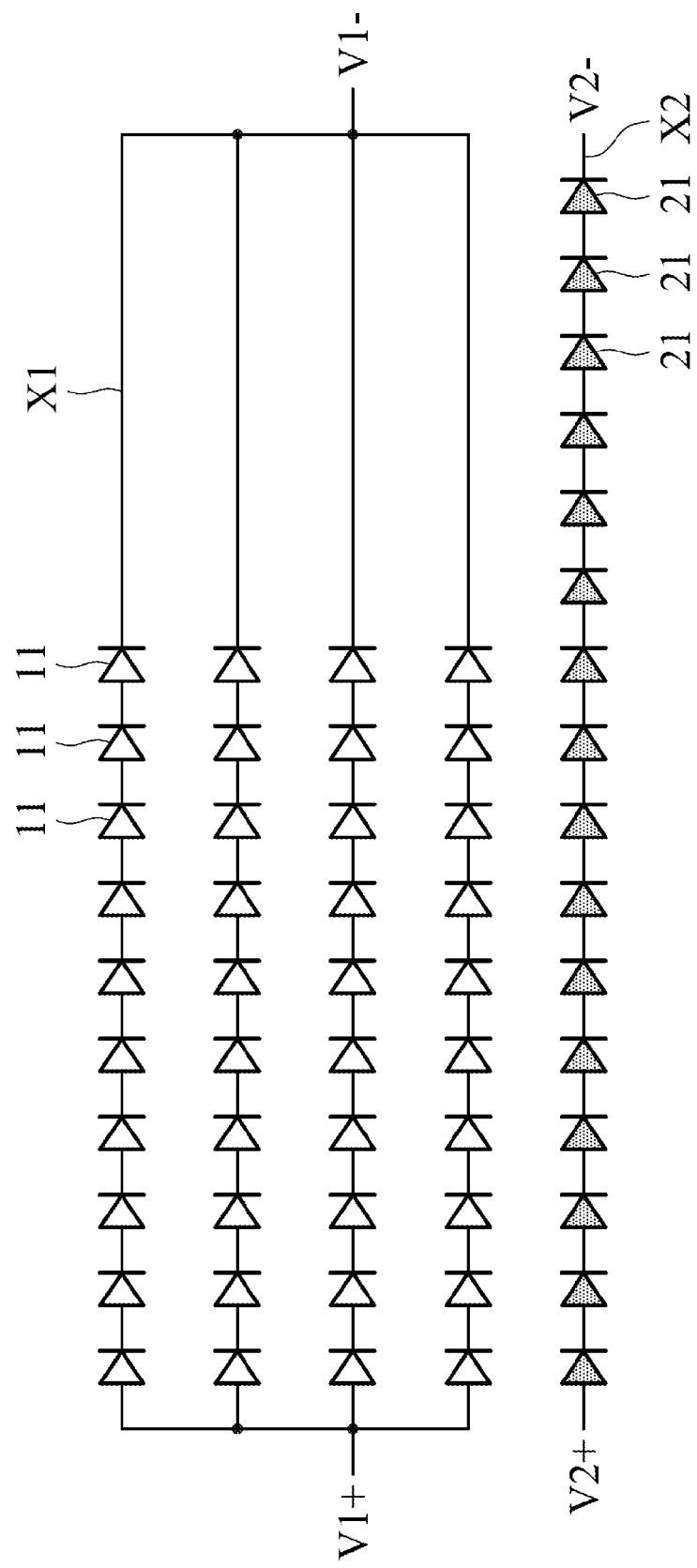
FIGS. 1A, 1B and 1C show methods of driving solid light emitting semiconductors according to the first embodiment of the invention.

Methods of driving solid light emitting semiconductors according to the first embodiment of the invention are disclosed below. Referring to FIG. 1A, in the embodiment as shown in FIG. 1A, the first solid light emitting semiconductors 11 are serially connected (connected in series) to form a plurality of first solid light emitting semiconductor strings X1, and the second solid light emitting semiconductors 21 are serially connected to form a second solid light emitting semiconductor string X2. The first solid light emitting semiconductor strings X1 are connected in parallel and are driven by a first driving voltage V1, and the second solid light emitting semiconductor string X2 is driven by a second driving voltage V2. In the present embodiment, the currents of the first solid light emitting semiconductor strings X1 and the second solid light emitting semiconductor string X2 may be the same or different.

Figure 1B:
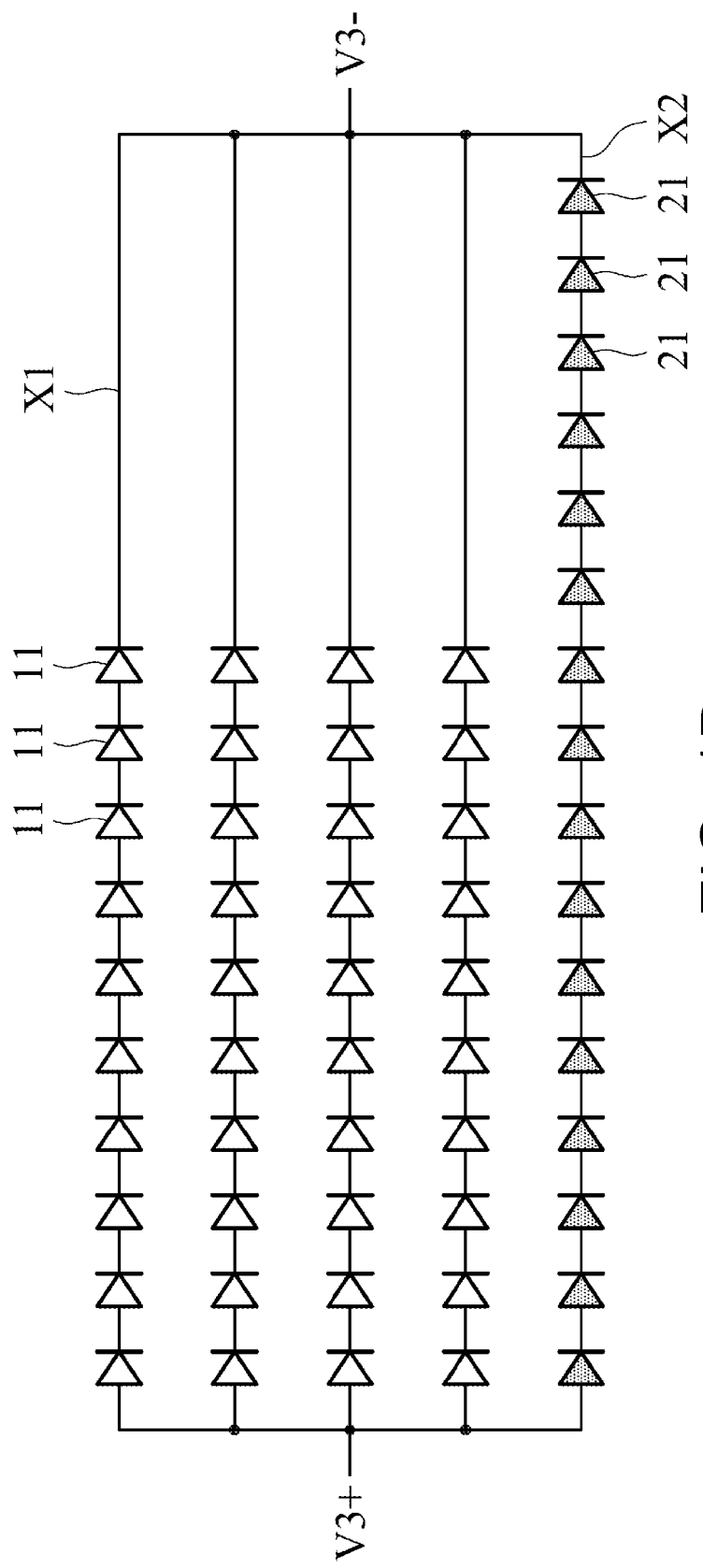

Referring to FIG. 1B, in the embodiment as shown in FIG. 1B, the first solid light emitting semiconductor strings X1 and the second solid light emitting semiconductor string X2 are connected in parallel and are driven by a third driving voltage V3. In the present embodiment, the currents of the first solid light emitting semiconductor strings X1 and the second solid light emitting semiconductor string X2 may be the same or different.

Figure 1C:
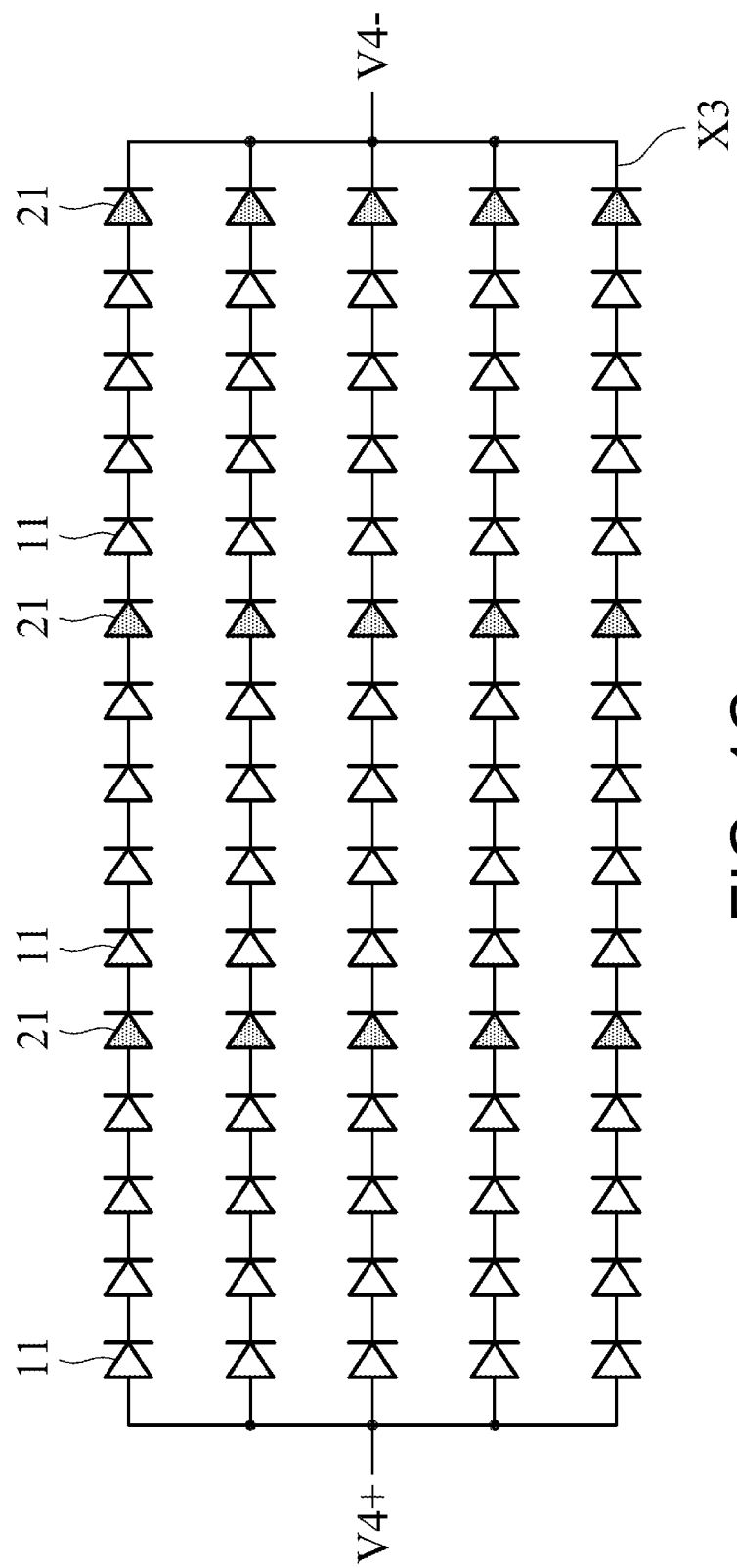

Referring to FIG. 1C, in the embodiment as shown in FIG. 1C, the first solid light emitting semiconductors 11 and the second solid light emitting semiconductors 21 are serially connected to form a plurality of third solid light emitting semiconductor strings X3 connected in parallel and driven by a fourth driving voltage V4. Each of the third solid light emitting semiconductor strings X3 has the same number of the first solid light emitting semiconductors 11, and each of the third solid light emitting semiconductor strings X3 has the same number of the second solid light emitting semiconductors 21.

Figure 2:
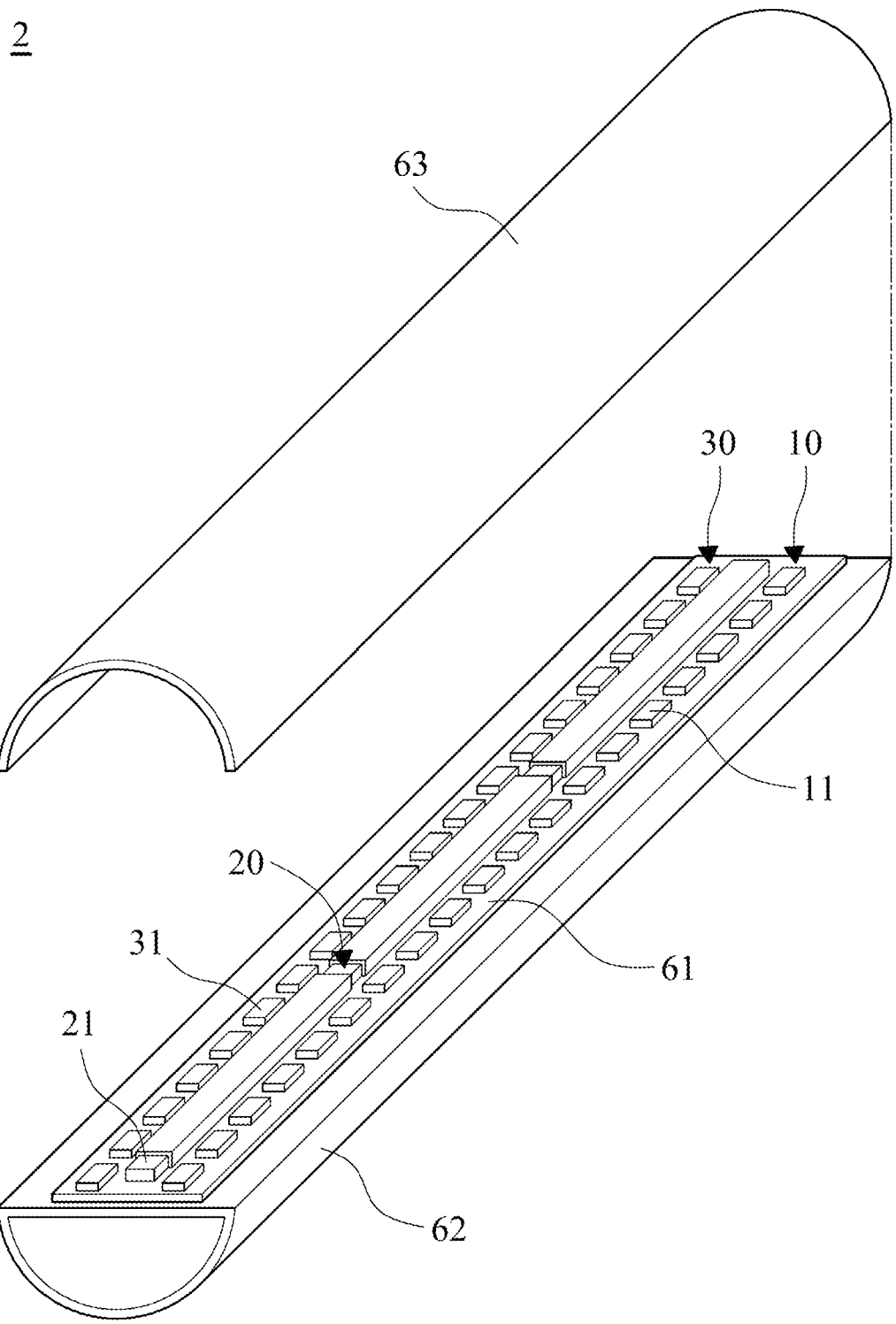
FIG. 2 shows a lighting module according to a second embodiment of the invention.

Referring to FIG. 2, a lighting module 2 according to a second embodiment of the invention is shown. In comparison to the first embodiment, the lighting module 2 further comprises a third light source array 30 disposed on the circuit board. The third light source array 30 comprises a plurality of third solid light emitting semiconductors 31 providing a third light with a third wavelength. The first light source array 10, the second light source array 20, and the third light source array 30 are arranged in parallel directions, and the second light source array 20 is located between the first light source array 10 and the third light source array 30. In the present embodiment, the second light source array 20 provides a complementary light, and the first light source array 10 and the third light source array 30 provide a main light, wherein the first wavelength and the third wavelength may be the same or different.

Figure 2A:
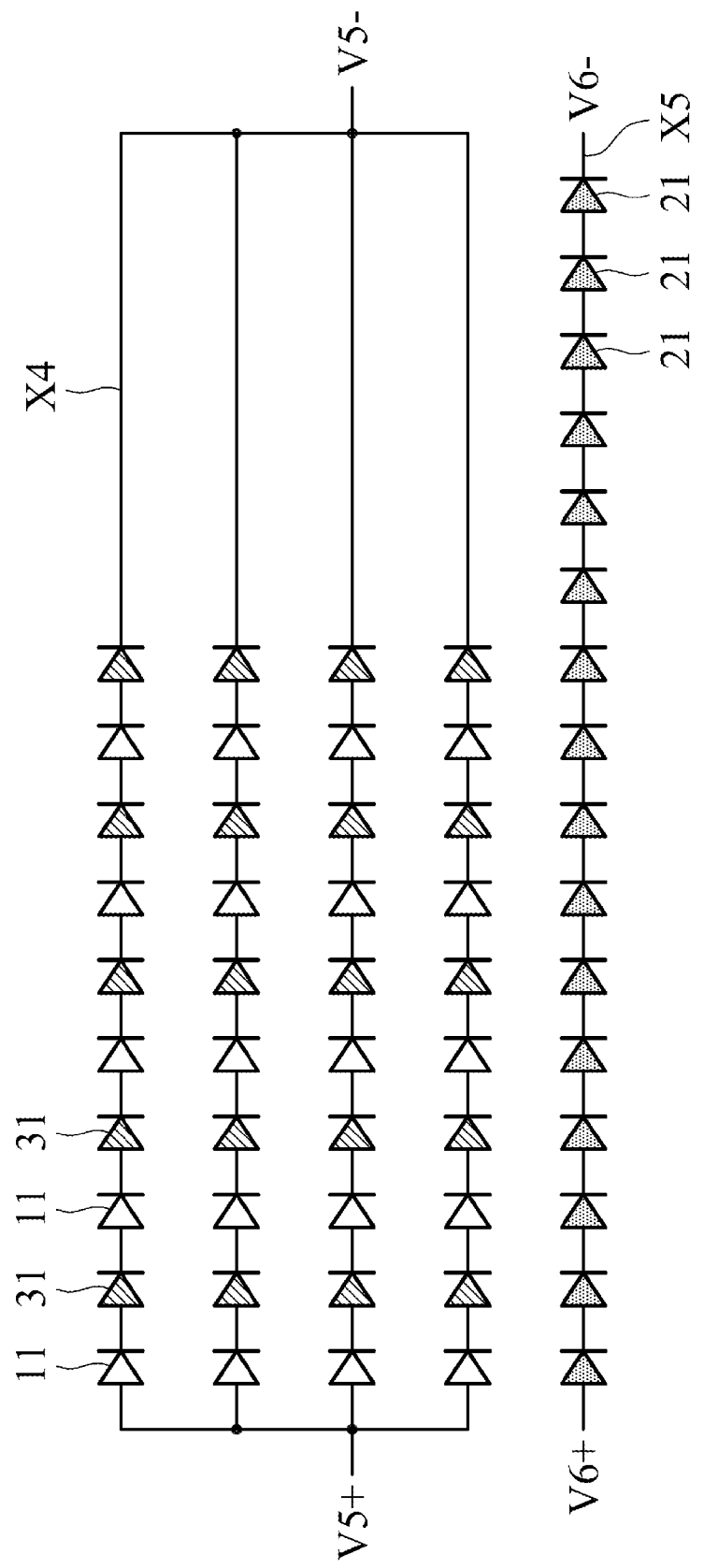
FIGS. 2A, 2B and 2C show methods of driving solid light emitting semiconductors according to the second embodiment of the invention.

Methods of driving solid light emitting semiconductors according to the second embodiment of the invention are disclosed below. Referring to FIG. 2A, in the embodiment as shown in FIG. 2A, the first solid light emitting semiconductors 11 and the third solid light emitting semiconductors 31 are serially connected to form a plurality of fourth solid light emitting semiconductor strings X4, the second solid light emitting semiconductors 21 are serially connected to form a fifth solid light emitting semiconductor string X5. The fourth solid light emitting semiconductor strings X4 are connected in parallel and are driven by a fifth driving voltage V5, and the fifth solid light emitting semiconductor string X5 is driven by a sixth driving voltage V6. In the present embodiment, the currents of the fifth solid light emitting semiconductor string X5 and the fourth solid light emitting semiconductor strings X4 may be the same or different.

Figure 2B:
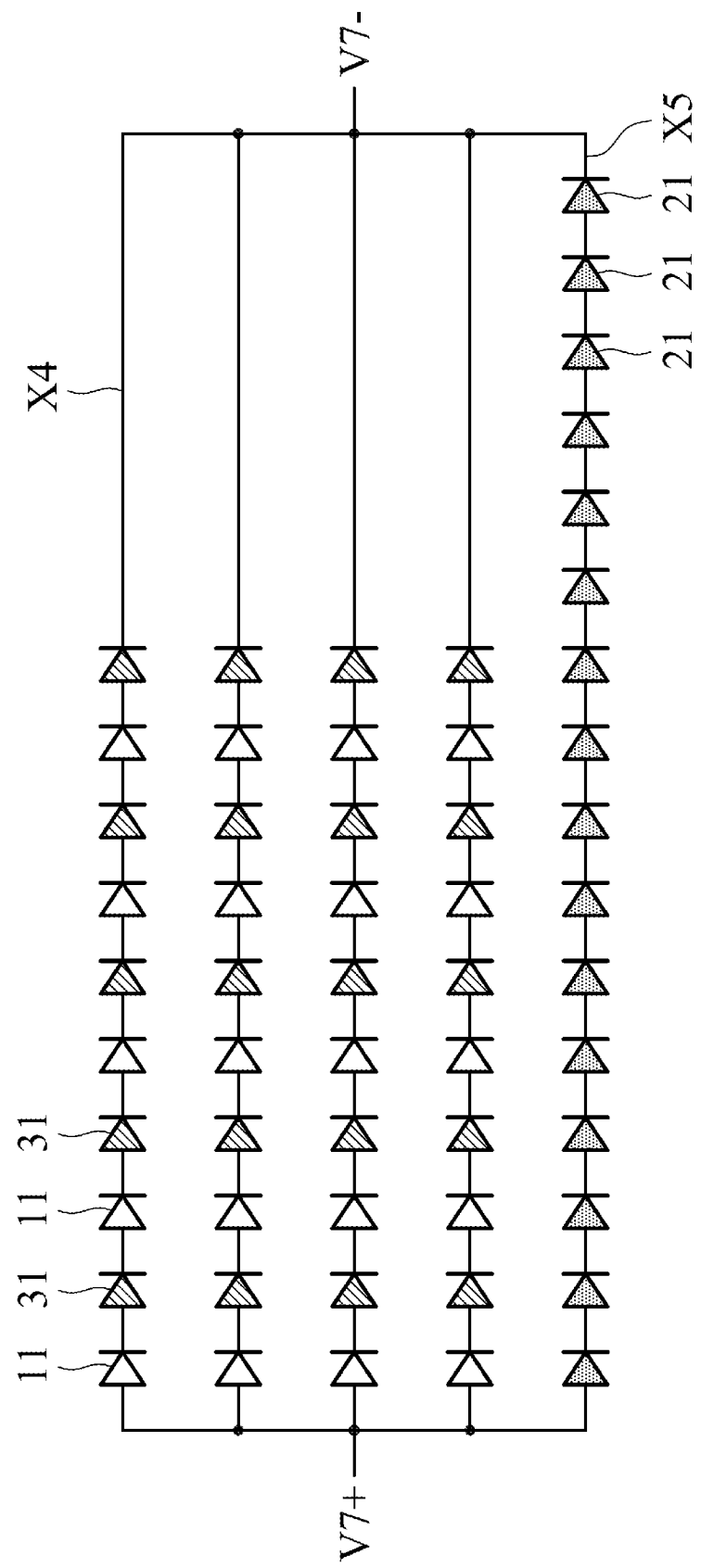

Referring to FIG. 2B, in the embodiment as shown in FIG. 2B, the fourth solid light emitting semiconductor strings X4 and the fifth solid light emitting semiconductor string X5 are connected in parallel and are driven by a seventh driving voltage V7. In the present embodiment, the currents of the fifth solid light emitting semiconductor string X5 and the fourth solid light emitting semiconductor strings X4 may be the same or different.

Figure 2C:
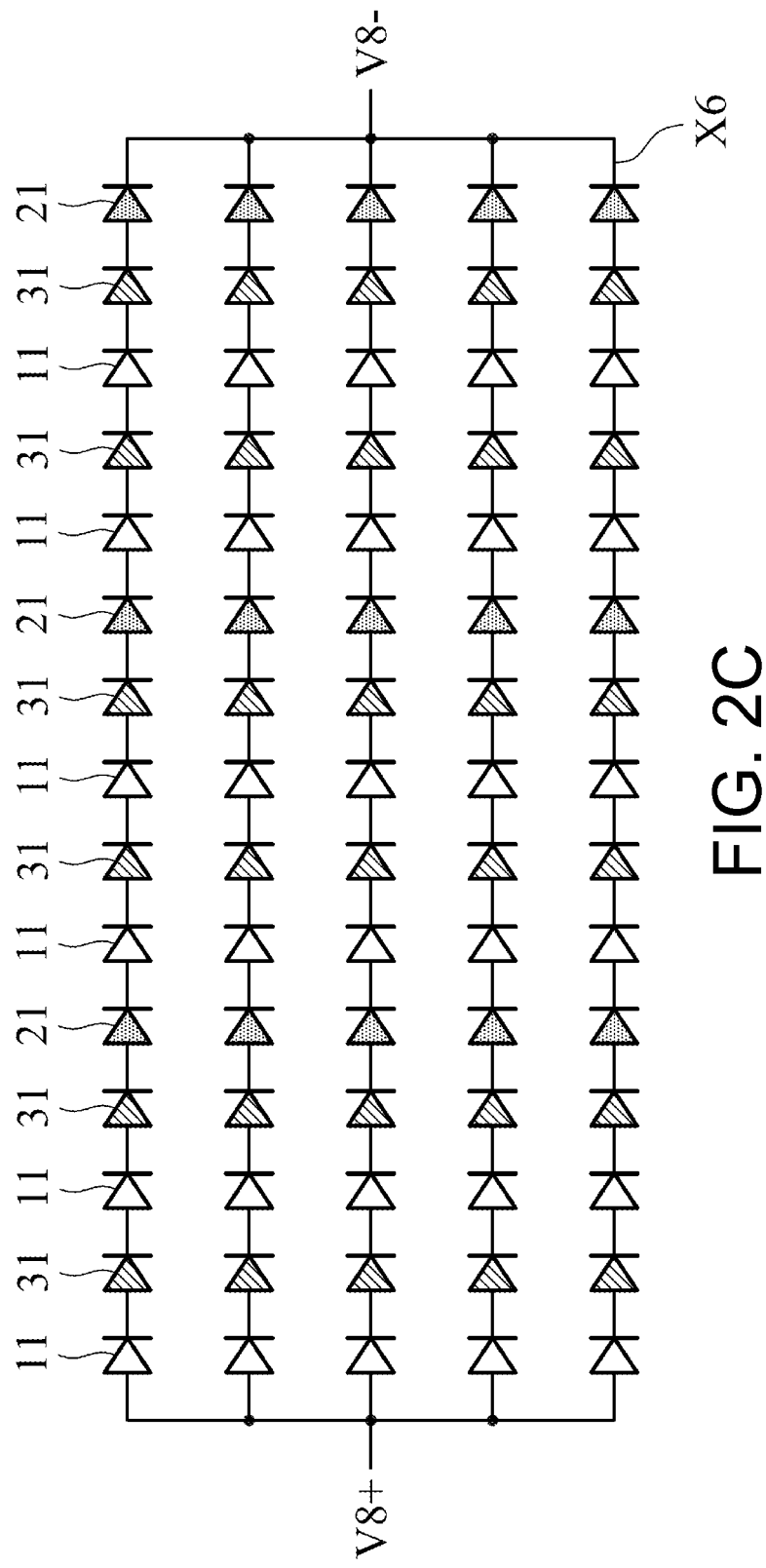

Referring to FIG. 2C, in the embodiment as shown in FIG. 2C, the first solid light emitting semiconductors 11, the second solid light emitting semiconductors 21, and the third solid light emitting semiconductors 31 are mixed and serially connected to form a plurality of sixth solid light emitting semiconductor strings X6, wherein the sixth solid light emitting semiconductor strings X6 are connected in parallel and are driven by an eighth driving voltage V8. Each of the sixth solid light emitting semiconductor strings X6 has the same number of the first solid light emitting semiconductors 11, each of the sixth solid light emitting semiconductor strings X6 has the same number of the second solid light emitting semiconductors 21, and each of the sixth solid light emitting semiconductor strings X6 has the same number of the third solid light emitting semiconductors 31.

Figure 3:
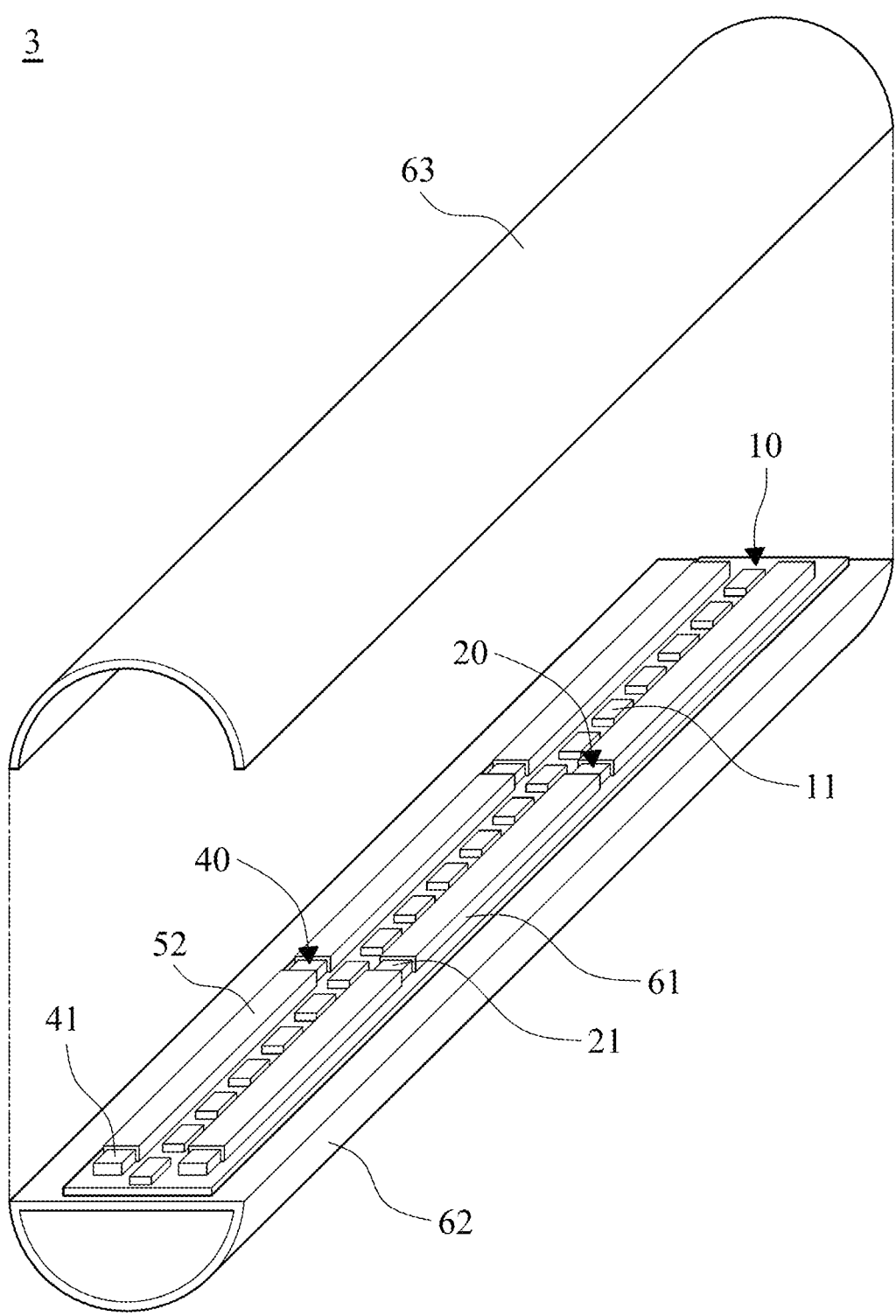
FIG. 3 shows a lighting module according to a third embodiment of the invention.

Referring to FIG. 3, a lighting module according to a third embodiment of the invention is shown. In comparison to the first embodiment, the lighting module 3 further comprises a fourth light source array 40 and a plurality of second light guides 52. The fourth light source array 40 is disposed on the circuit board 61 and comprises a plurality of fourth solid light emitting semiconductors 41 providing a fourth light with a fourth wavelength. The second light guides 52 are disposed on the circuit board 61 and between the fourth solid light emitting semiconductors 41. The fourth solid light emitting semiconductors 41 are located on a side of each of the second light guides 52, respectively, so that the light emitted by the fourth solid light emitting semiconductors 41 enters the second light guides 52 to be uniformly emitted. The first light source array 10, the second light source array 20, and the fourth light source array 40 are arranged in parallel directions, and the first light source array 10 is located between the second light source array 20 and the fourth light source array 40. In the present embodiment, the first light source array 10 provides a main light, and the second light source array 20 and the fourth light source array 40 provide a complementary light, wherein the second wavelength and the fourth wavelength may be the same or different.

Figure 3A:
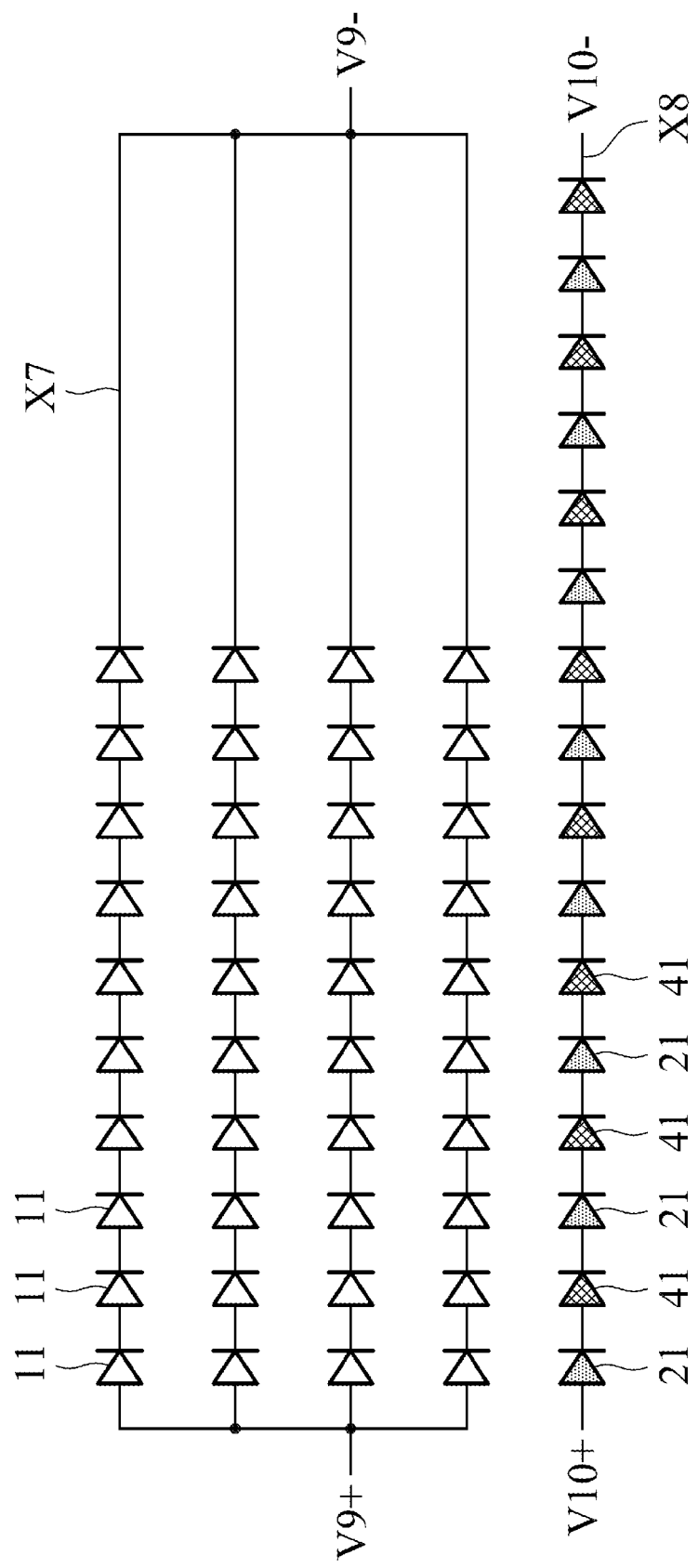
FIGS. 3A, 3B and 3C show methods of driving solid light emitting semiconductors according to the third embodiment of the invention.

Methods of driving solid light emitting semiconductors according to the third embodiment of the invention are disclosed below. Referring to FIG. 3A, in the embodiment as shown in FIG. 3A, the first solid light emitting semiconductors 11 are serially connected to form a plurality of seventh solid light emitting semiconductor strings X7, and the second solid light emitting semiconductors 21 and the fourth solid light emitting semiconductors 41 are serially connected to form an eighth solid light emitting semiconductor string X8. The seventh solid light emitting semiconductor strings X7 are connected in parallel and are driven by a ninth driving voltage V9, and the eighth solid light emitting semiconductor string X8 is driven by a tenth driving voltage V10. In the present embodiment, the currents of the eighth solid light emitting semiconductor string X8 and the seventh solid light emitting semiconductor strings X7 may be the same or different.

Figure 3B:
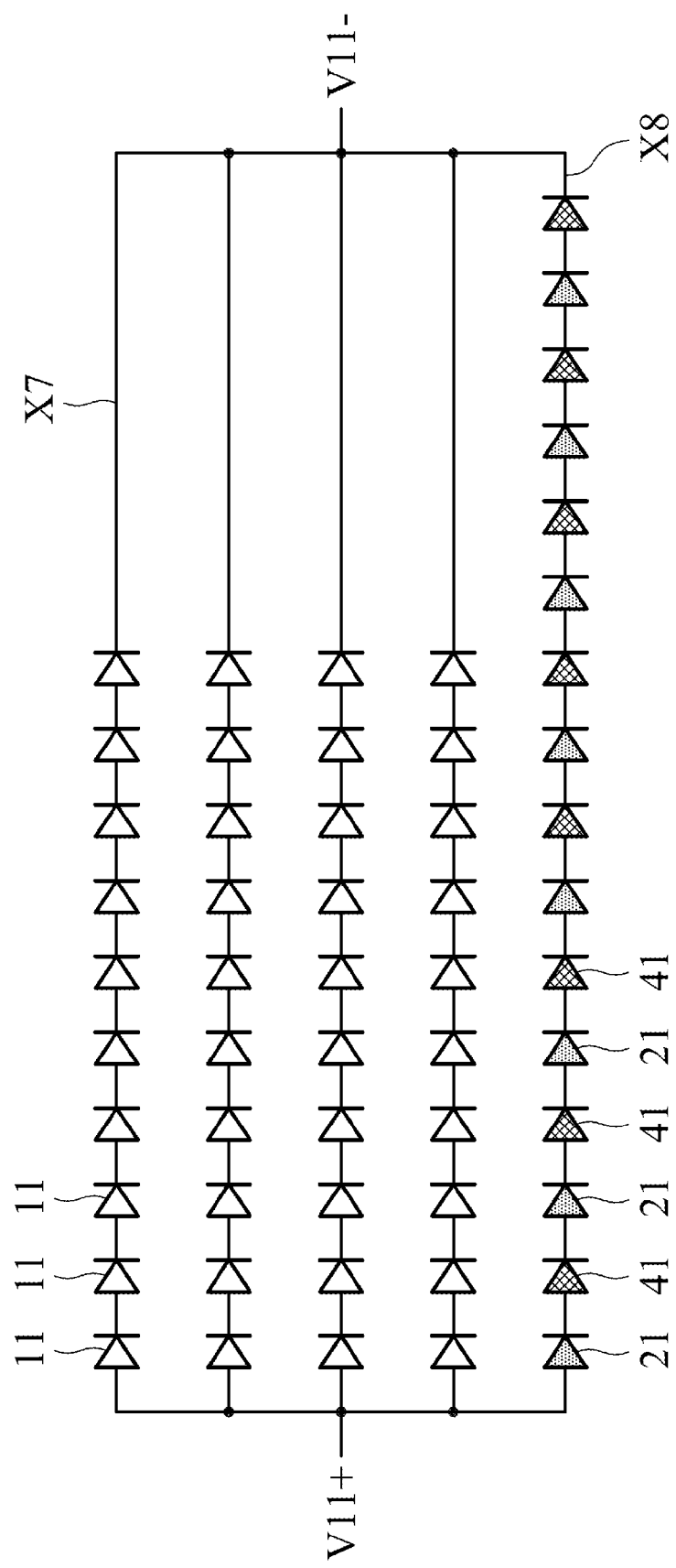

Referring to FIG. 3B, in the embodiment as shown in FIG. 3B, the seventh solid light emitting semiconductor strings X7 and the eighth solid light emitting semiconductor string X8 are connected in parallel and are driven by an eleventh driving voltage V11. In the present embodiment, the currents of the eighth solid light emitting semiconductor string X8 and the seventh solid light emitting semiconductor strings X7 may be the same or different.

Figure 3C:
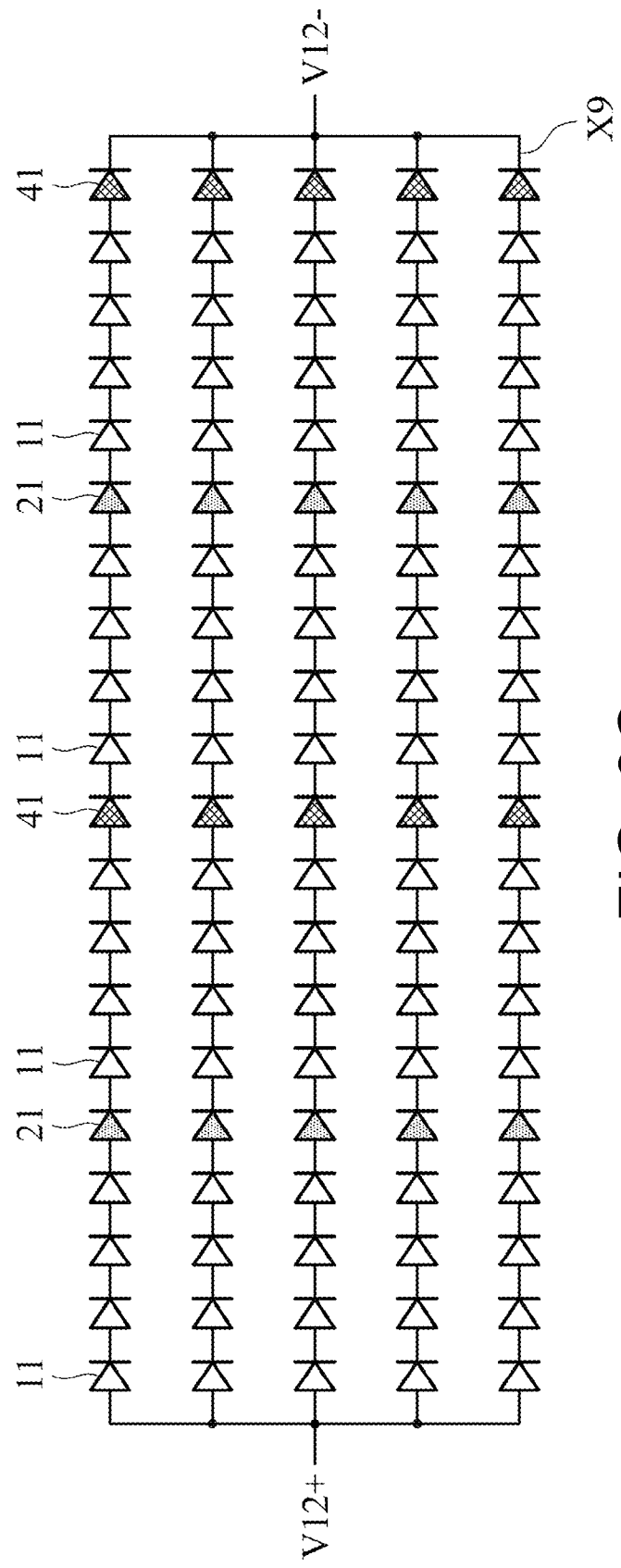

Referring to FIG. 3C, in the embodiment as shown in FIG. 3C, the first solid light emitting semiconductors 11, the second solid light emitting semiconductors 21, and the fourth solid light emitting semiconductors 41 are mixed and serially connected to form a plurality of ninth solid light emitting semiconductor strings X9. The ninth solid light emitting semiconductor strings X9 are connected in parallel and are driven by a twelfth driving voltage V12. Each of the ninth solid light emitting semiconductor strings X9 has the same number of the first solid light emitting semiconductors 11, each of the ninth solid light emitting semiconductor strings X9 has the same number of the second solid light emitting semiconductors 21, and each of the ninth solid light emitting semiconductor strings X9 has the same number of the fourth solid light emitting semiconductors 41.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A lighting module, comprising:
a circuit board;
a first light source array disposed on the circuit board, wherein the first light source array comprises a plurality of first solid light emitting semiconductors providing a first light with a first wavelength;
a second light source array disposed on the circuit board, wherein the second light source array comprises a plurality of second solid light emitting semiconductors providing a second light with a second wavelength; and
a plurality of first light guides disposed on the circuit board and between the second solid light emitting semiconductors, wherein the second solid light emitting semiconductors are located on a side of each of the first light guides, respectively, so that the second light emitted by the second solid light emitting semiconductors enters the first light guides to be uniformly emitted.

2. The lighting module according to claim 1, further comprising a third light source array disposed on the circuit board, wherein the third light source array comprises a plurality of third solid light emitting semiconductors providing a third light with a third wavelength.

3. The lighting module according to claim 2, wherein the first light source array, the second light source array, and the third light source array are arranged in parallel directions, and the second light source array is located between the first light source array and the third light source array.

4. The lighting module according to claim 2, wherein the first wavelength and the third wavelength are the same or different.

5. The lighting module according to claim 1, further comprising:
a fourth light source array disposed on the circuit board, wherein the fourth light source array comprises a plurality of fourth solid light emitting semiconductors providing a fourth light with a fourth wavelength; and
a plurality of second light guides disposed on the circuit board and between the fourth solid light emitting semiconductors, wherein the fourth solid light emitting semiconductors are located on a side of each of the second light guides, respectively, so that the fourth light emitted by the fourth solid light emitting semiconductors enters the second light guides to be uniformly emitted.

6. The lighting module according to claim 5, wherein the first light source array, the second light source array, and the fourth light source array are arranged in parallel directions, and the first light source array is located between the second light source array and the fourth light source array.

7. The lighting module according to claim 5, wherein the second wavelength and the fourth wavelength are the same or different.

8. The lighting module according to claim 1, wherein the first solid light emitting semiconductors are connected in series to form a plurality of first solid light emitting semiconductor strings, and the second solid light emitting semiconductors are connected in series to form a second solid light emitting semiconductor string.

9. The lighting module according to claim 8, wherein the first solid light emitting semiconductor strings are connected in parallel and are driven by a first driving voltage, and the second solid light emitting semiconductor string is driven by a second driving voltage.

10. The lighting module according to claim 8, wherein the first solid light emitting semiconductor strings and the second solid light emitting semiconductor string are connected in parallel and are driven by a third driving voltage.

11. The lighting module according to claim 1, wherein the first solid light emitting semiconductors and the second solid light emitting semiconductor are connected in series to form a plurality of third solid light emitting semiconductor strings, and the third solid light emitting semiconductor strings are connected in parallel and are driven by a fourth driving voltage.

12. The lighting module according to claim 11, wherein each of the third solid light emitting semiconductor strings has the same number of the first solid light emitting semiconductors, and each of the third solid light emitting semiconductor strings has the same number of the second solid light emitting semiconductors.

13. The lighting module according to claim 2, wherein the first solid light emitting semiconductors and the third solid light emitting semiconductors are connected in series to form a plurality of fourth solid light emitting semiconductor strings, and the second solid light emitting semiconductors are connected in series to form a fifth solid light emitting semiconductor string.

14. The lighting module according to claim 13, wherein the fourth solid light emitting semiconductor strings are connected in parallel and are driven by a fifth driving voltage, and the fifth solid light emitting semiconductor string is driven by a sixth driving voltage.

15. The lighting module according to claim 13, wherein the fourth solid light emitting semiconductor strings and the fifth solid light emitting semiconductor string are connected in parallel and are driven by a seventh driving voltage.

16. The lighting module according to claim 2, wherein the first solid light emitting semiconductors, the second solid light emitting semiconductors, and the third solid light emitting semiconductors are mixed and connected in series to form a plurality of sixth solid light emitting semiconductor strings, and the sixth solid light emitting semiconductor strings are connected in parallel and driven by an eighth driving voltage.

17. The lighting module according to claim 16, wherein each of the sixth solid light emitting semiconductor strings has the same number of the first solid light emitting semiconductors, each of the sixth solid light emitting semiconductor strings has the same number of the second solid light emitting semiconductors, and each of the sixth solid light emitting semiconductor strings has the same number of the third solid light emitting semiconductors.

18. The lighting module according to claim 5, wherein the first solid light emitting semiconductors are connected in series to form a plurality of seventh solid light emitting semiconductor strings, and the second solid light emitting semiconductors and the fourth solid light emitting semiconductors are connected in series to form an eighth solid light emitting semiconductor string.

19. The lighting module according to claim 18, wherein the seventh solid light emitting semiconductor strings are driven by a ninth driving voltage, and the eighth solid light emitting semiconductor string is driven by a tenth driving voltage.

20. The lighting module according to claim 18, wherein the seventh solid light emitting semiconductor strings and the eighth solid light emitting semiconductor string are connected in parallel and are driven by an eleventh driving voltage.

21. The lighting module according to claim 5, wherein the first solid light emitting semiconductors, the second solid light emitting semiconductors, and the fourth solid light emitting semiconductors are mixed and connected in series to form a plurality of ninth solid light emitting semiconductor strings connected in parallel and driven by a twelfth driving voltage.

22. The lighting module according to claim 21, wherein each of the ninth solid light emitting semiconductor strings has the same number of the first solid light emitting semiconductors, each of the ninth solid light emitting semiconductor strings has the same number of the second solid light emitting semiconductors, and each of the ninth solid light emitting semiconductor strings has the same number of the fourth solid light emitting semiconductors.

23. The lighting module according to anyone of claim 1, further comprising:
a base for carrying the circuit board.

24. The lighting module according to claim 23, further comprising a transparent or semi-transparent mask located on the base for covering the circuit board.

* * * * *